(12) United States Patent
Qiu et al.

(10) Patent No.: US 8,432,673 B2
(45) Date of Patent: Apr. 30, 2013

(54) DISPLAY DEVICE

(75) Inventors: Ji-Feng Qiu, Shenzhen (CN); Ke-Hui Peng, Shenzhen (CN); Na Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 299 days.

(21) Appl. No.: 12/915,073

(22) Filed: Oct. 29, 2010

(65) Prior Publication Data
US 2012/0019989 A1 Jan. 26, 2012

(30) Foreign Application Priority Data
Jul. 23, 2010 (CN) .......................... 2010 1 0234730

(51) Int. Cl.
*G06F 1/16* (2006.01)
(52) U.S. Cl.
USPC .................. 361/679.21; 312/332.1; 349/326; 248/309.1

(58) Field of Classification Search .............. 312/332.1, 312/333, 228, 223.1, 223.2, 221, 216, 265.1, 312/265.6; 349/58, 60, 327, 370, 326, 59, 349/630, 541.5; 361/704, 807, 679.21, 679.22, 361/679.23, 679.26, 679.27, 679.06, 679.48, 361/679.41, 679.47; 248/125.1, 590, 629, 248/209, 309.1, 276.1, 96
See application file for complete search history.

(56) References Cited

U.S. PATENT DOCUMENTS

| | | | |
|---|---|---|---|
| 7,372,516 B2* | 5/2008 | Liou et al. | 349/58 |
| 7,907,233 B2* | 3/2011 | Kang et al. | 349/60 |
| 2007/0146979 A1* | 6/2007 | Chen et al. | 361/681 |

* cited by examiner

*Primary Examiner* — Hung Duong
(74) *Attorney, Agent, or Firm* — Altis Law Group, Inc.

(57) ABSTRACT

A display device includes a shell, a display panel disposed within the shell and at least one securing member fixing the display panel to the shell. The display panel is covered with a front cover and a rear cover opposite to the front cover. The at least one securing member is fixed to the shell and resists at least the rear cover of the display panel. The at least one securing member includes a conducting member. The conducting member resists at least the front cover of the display panel to conduct static electricity therefrom.

9 Claims, 6 Drawing Sheets

DISPLAY DEVICE

BACKGROUND

1. Technical Field

The present disclosure relates to display devices.

2. Description of Related Art

Referring to FIGS. 5-6, a display panel 20, such as LCD panel, is mounted to a shell 30 of a display device by a plurality of fixing members 21, such as bolts or screws. The fixing members 21 are conductive. A front cover 201 and a rear cover 202 assembled to the front cover 201 cover the display panel 20 and conduct static electricity. The display panel 20 is mounted to the shell 30 by the fixing members 21. In detail, the fixing members 21 are fixed to the shell 30 and resist the rear cover 202. Thus, the display panel 20 is fixed to the shell 30, and static electricity generated in the display panel 20 is conducted from the rear cover 202 to be grounded by the fixing members 21.

However, the front cover 201 sometimes contacts the rear cover 202 incompletely, such that static electricity in the front cover 201 may not be grounded.

Therefore, there is room for improvement in the art.

BRIEF DESCRIPTION OF THE DRAWINGS

The components of the drawings are not necessarily drawn to scale, the emphasis instead being placed upon clearly illustrating the principles of the embodiments of the display device. Moreover, in the drawings, like reference numerals designate corresponding parts throughout several views.

DETAILED DESCRIPTION

Figure 1:
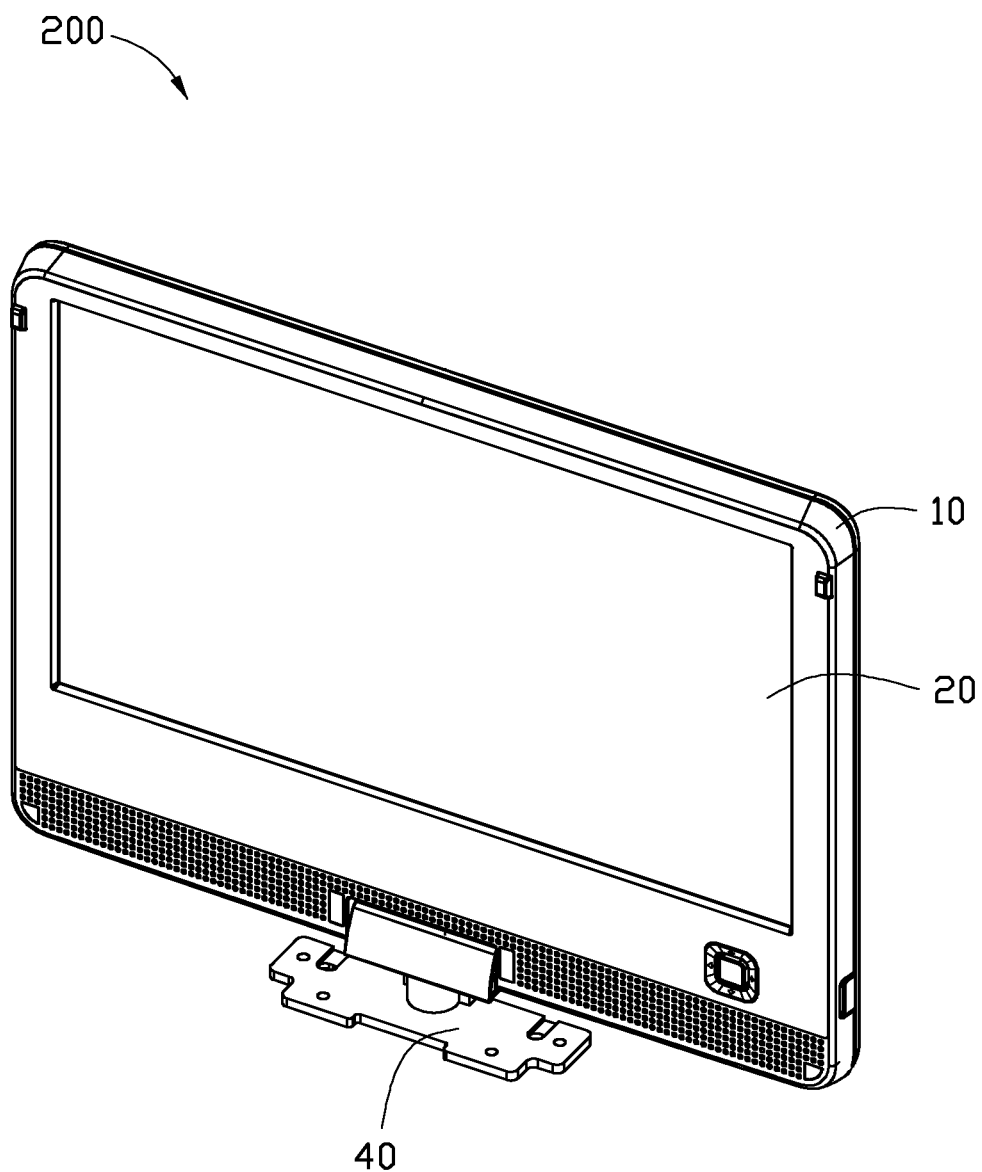
FIG. 1 is a perspective view of a display device in accordance with one embodiment.
Figure 2:
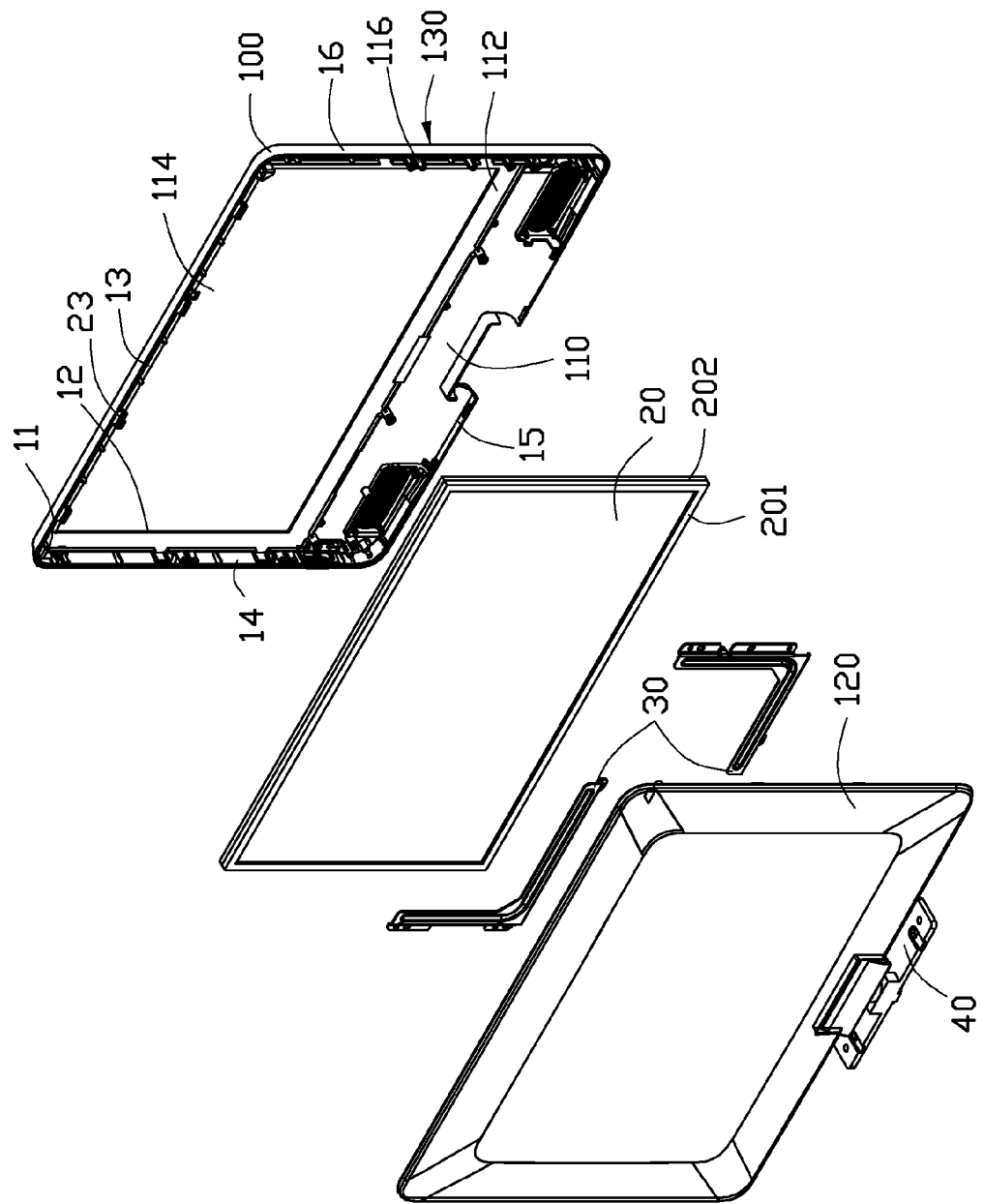
FIG. 2 is a disassembled view of the display device in FIG. 1; the display device including a front portion, a rear portion, two securing members and a display panel.

Referring to FIGS. 1-2, a display device 200 is shown. The display device 200 can be a LCD (Liquid Crystal Display) of a computer or a TV. The display device 200 includes a shell 10, a display panel 20 fixed in the shell 10, two securing members 30 fixing the display panel 20 to the shell 10, and a circuit board (not shown) received in the shell 10. A front cover 201 and a rear cover 202 cover the display panel 20. The front cover 201 and the rear cover 202 are metal, and conduct static electricity from the display panel 20. The shell 10 can be plastic or metal. The display device 200 further includes a stand 40, such that the display device 200 is deployed on a surface (not shown).

The shell 10 includes a front portion 100 and a rear portion 120. The front portion 100 covers the rear portion 120 to form a receiving space (not labeled) for receiving the display panel 20 and the circuit board.

The front portion 100 includes a rectangular base 12, and four sidewalls (hereinafter, a first sidewall 13, a second sidewall 14, a third sidewall 15, and a fourth sidewall 16) protruding from four rims of the base 12. The first sidewall 13, the second sidewall 14, the third sidewall 15 opposite to the first sidewall 13, and the fourth sidewall 16 opposite to the second sidewall 14 are serially interconnected with each other to define a portion of the receiving space.

The base 12 includes an inner surface 110 facing the rear portion 120 and an outer surface 130 opposite to the inner surface 110. The inner surface 110 recesses inwardly to define a receiving space 112. The receiving space 112 is substantially rectangular, and receives the display panel 20. The bottom of the receiving space 112 further defines an opening 114. The opening 114 is substantially rectangular, and the display panel 20 is visible at the opening 114. It is noteworthy that the size of the display panel 20 is less than that of the receiving space 112 but exceeds that of the opening 114.

A plurality of fixing posts 116 protrudes from the base 12, fixing the securing members 30 and arranged adjacent to the sidewalls of the receiving space 112.

Figure 3:
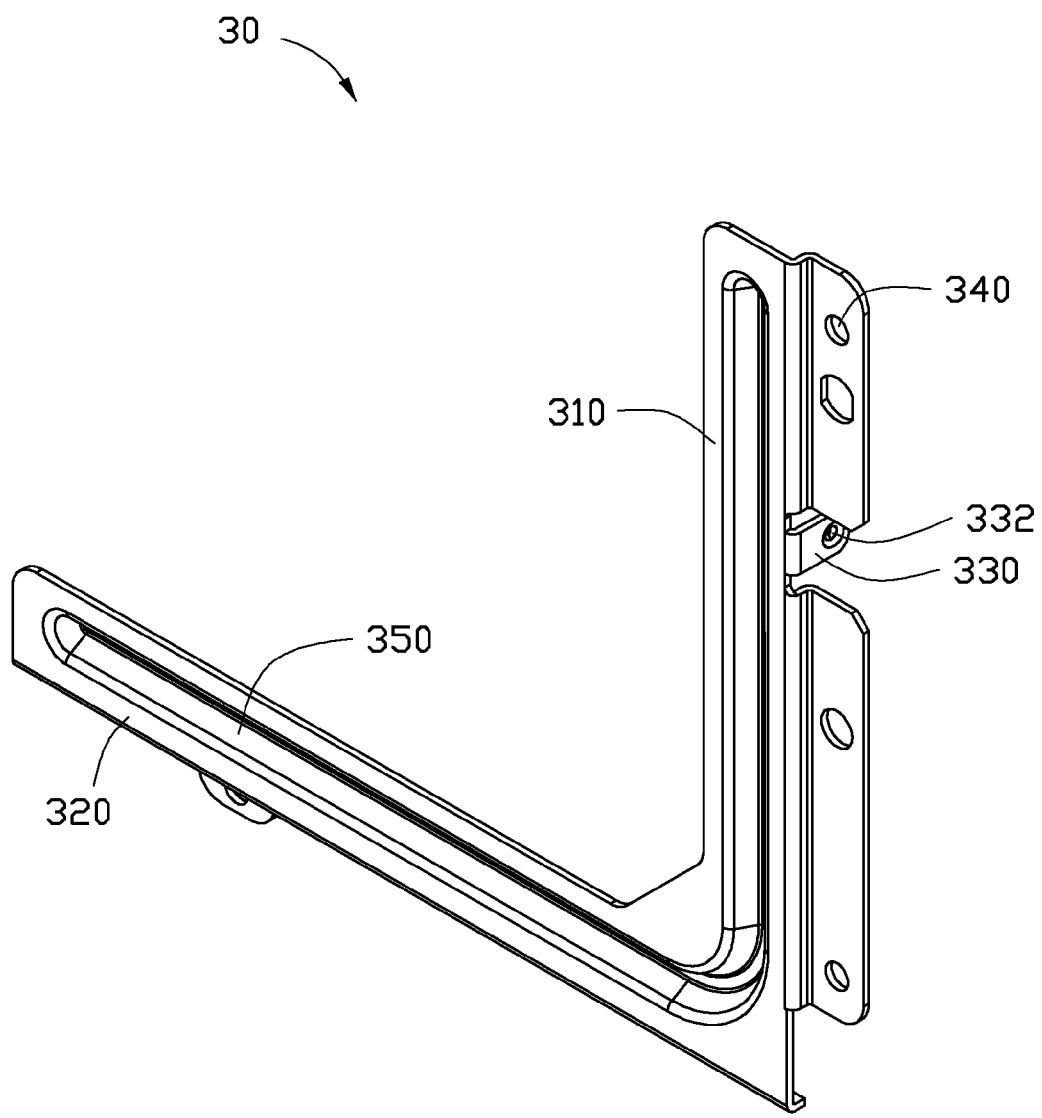
FIG. 3 is an enlarged view showing one of the securing members in FIG. 2.
Figure 4:
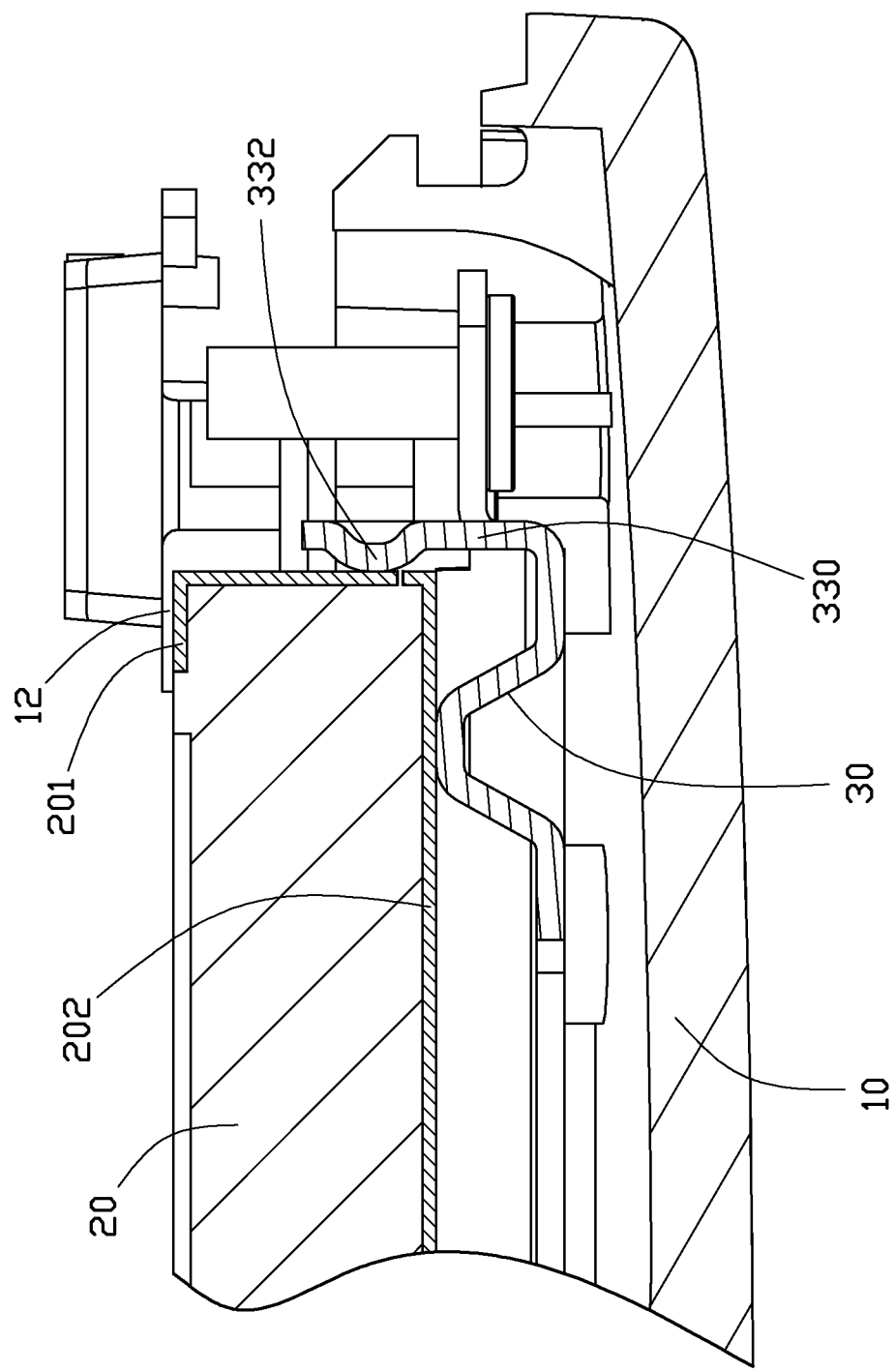
FIG. 4 is explanatory view showing the securing member resisting the display panel of the display device in FIG. 3.
Figure 5:
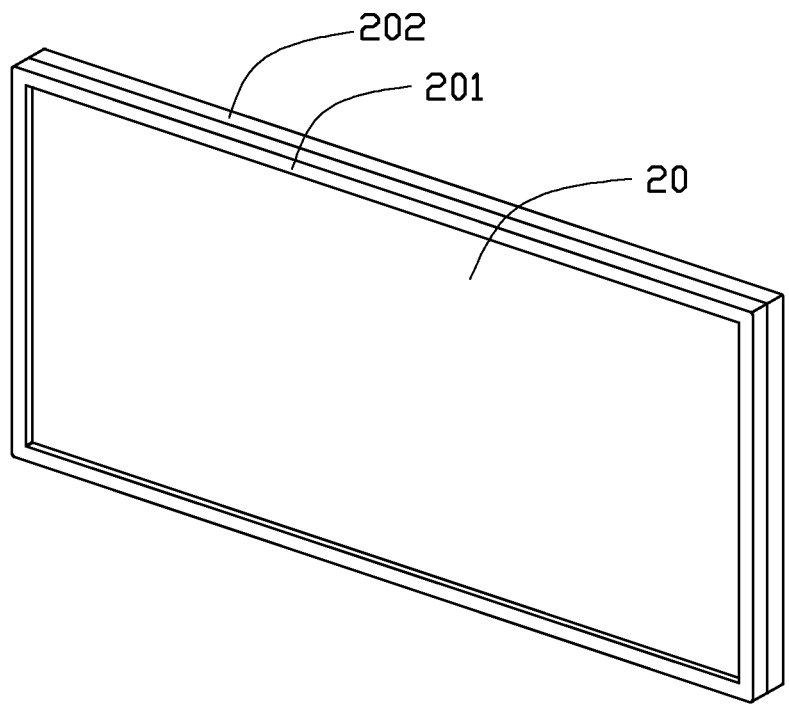
FIG. 5 is a perspective view of a commonly used display panel.
Figure 6:
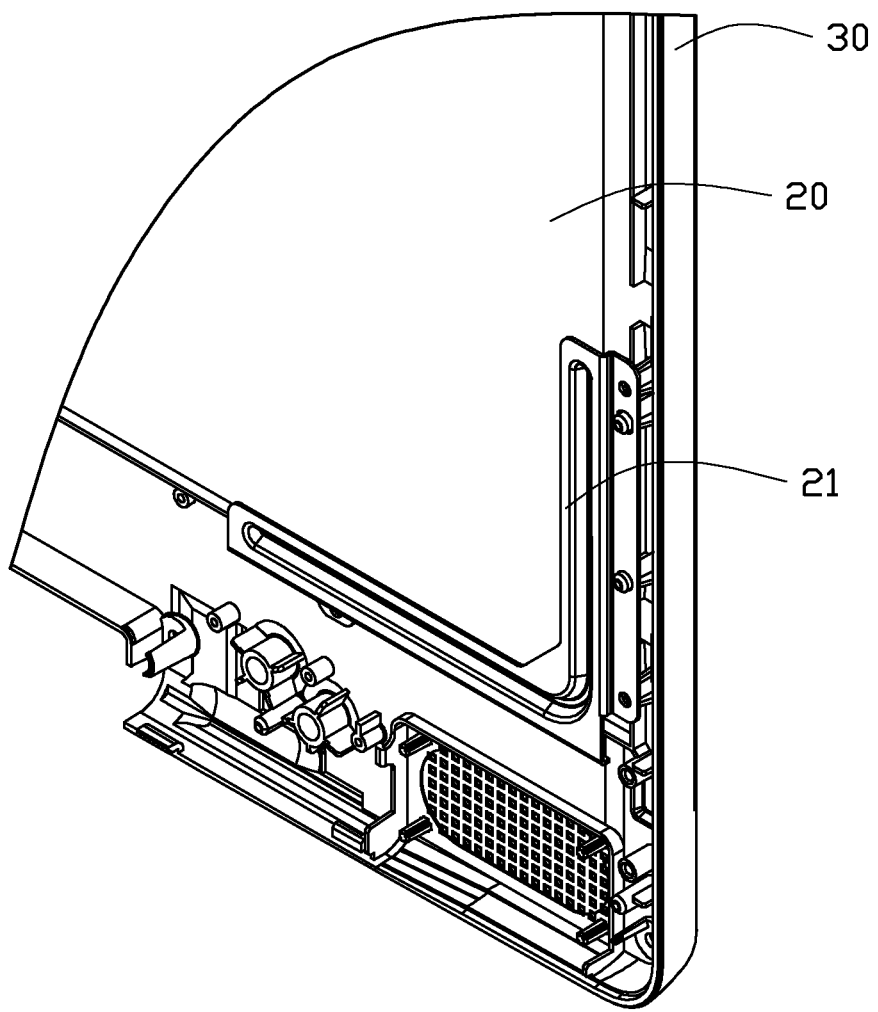
FIG. 6 is a partially assembled view showing the display panel in FIG. 5 fixed to a shell of a display device by related art fixing members.

Referring to FIG. 3, the securing members 30 are substantially L-shaped and fix the display panel 20 to the front portion 100 of the shell 10. Each securing member 30 includes a first arm 310 and a second arm 320. The first arm 310 is perpendicular to the second arm 320. Referring further to FIG. 4, a conducting member 330 protrudes integrally from a rim of the first arm 310 extending toward the base 12. The conducting member 330 recesses toward the display panel 20 to define a protrusion 332. The protrusion 332 resists the front cover 201 of the display panel 20. Thus, the front cover 201 of the display panel 20 is conducted directly to the securing members 30, and static electricity in the front cover 201 is directly grounded by way of the securing members 30.

In some embodiments, the protrusion 332 resists the join of the front cover 201 and the rear cover 202, such that the securing members 30 directly conduct the front cover 201 and the rear cover 202 simultaneously. As a result, when the front cover 201 contacts incompletely with the rear cover 202 or when the rear cover 202 contacts incompletely with the front cover 201, static electricity in the display panel 20 is grounded by way of the securing members 30.

The securing members 30 further define a plurality of holes 340 corresponding to the fixing posts 116. Fixing members, such as screws or bolts, extend through the holes 340 and thread into the corresponding fixing posts 116 to fix the securing members 30 to the front portion 100 of the shell 10.

In the embodiment, to protect the rear cover 202 of the display panel 20 from contacting incompletely with the securing members 30, both the first arm 310 and the second arm 320 of each securing member 30 further recess toward the display panel 20 to cooperatively define a L-shaped abutting portion 350. The abutting portion 350 resists firmly the rear cover 202 of the display panel 20, such that static electricity in the rear cover 202 is conducted to the securing members 30 easily.

Furthermore, in accordance with prioritizing smaller device size and for simplified assembly of the display panel 20, a plurality of restricting members 23 (see FIG. 2) protrude integrally from the front portion 100 of the shell 10 to replace some of the securing members 30. In detail, the restricting members 23 protrude from the inner surface 110. The restricting members 23 are arranged adjacent to the first sidewall 13 and resist one sidewall of the receiving space 112 adjacent to the first sidewall 13. An end of the restricting member 23 opposite to the inner surface 110 angles toward the receiving space 112, such that an interval space (not labeled) is defined between the angled end of the restricting members 23 and the bottom of the receiving space 112. The interval space accommodates an end of the display panel 20. Thus, the restricting member 23 cooperates with the securing members 30 to fix the display panel 20 to the front portion 100 of the shell 10. It is noteworthy that the width of the interval space exceeds the thickness of the display panel 20, such that the display panel 20 can be securely fixed in the interval space.

In assembly, the display panel 20 is accommodated in the receiving space 112 with an end of the display panel 20 received in the interval space and securing members 30 fixed to the fixing posts 116 with the protrusion 332 of the conducting member 330 resisting the front cover 201. As a result, the display panel 20 is secured to the front portion 100 by the securing members 30 cooperating with the restricting members 23, and static electricity in the front cover 201 can be conducted directly to the securing members 30 and further grounded.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A display device, comprising:
   a shell;
   a display panel disposed within the shell and covered with a front cover and a rear cover opposite to the front cover; and
   at least one securing member fixed to the shell and resisting at least the rear cover of the display panel;
   wherein a conducting member protrudes integrally from the at least one securing member, and the conducting member recesses toward the display panel to define at least one protrusion resisting at least the front cover of the display panel to conduct static electricity therein.

2. The display device of claim 1, wherein the front cover, the rear cover and the at least one securing member are conductive.

3. The display device of claim 1, wherein the shell defines a receiving space for receiving the display panel.

4. The display device of claim 3, wherein at least one fixing post protrudes from the shell, the at least one securing member is fixed to the at least one fixing post to secure the display panel in the receiving space.

5. The display device of claim 1, wherein at least one restricting member protrudes integrally from the shell, the at least one restricting member cooperates with the at least one securing member to fix the display panel to the shell.

6. The display device of claim 5, wherein an end of the at least one restricting member angled toward the receiving space to cooperate with the bottom of the receiving space to define an interval space, the interval space is used to receive an end of the display panel.

7. The display device of claim 6, wherein the at least one restricting member is opposite to the at least one securing member.

8. The display device of claim 1, wherein the at least one protrusion resists the join of the front cover and the rear cover to conduct static electricity in the front cover and the rear cover simultaneously.

9. The display device of claim 1, wherein the at least one securing member recess toward the display panel to cooperatively define an abutting portion, the abutting portion resists the rear cover of the display panel to conduct static electricity therein the rear cover.

* * * * *